United States Patent [19]

Ikeda et al.

[11] Patent Number: 5,446,674

[45] Date of Patent: * Aug. 29, 1995

[54] CROSSTALK VERIFICATION DEVICE

[75] Inventors: Minoru Ikeda; Tsunesato Munakata, both of Itami, Japan

[73] Assignee: Mitsubishi Denki Kabushiki Kaisha, Tokyo, Japan

[ * ] Notice: The portion of the term of this patent subsequent to Mar. 30, 2010 has been disclaimed.

[21] Appl. No.: 70,291

[22] Filed: Jun. 2, 1993

[30] Foreign Application Priority Data

Jun. 9, 1992 [JP] Japan ................................. 4-149340

[51] Int. Cl.6 ............................................. H01L 25/00
[52] U.S. Cl. .................................... 364/489; 364/488; 364/490; 364/491; 364/578; 364/579; 364/580; 361/774; 361/775; 361/777; 371/23; 371/27
[58] Field of Search ................ 364/488, 489, 490, 491, 364/578, 579, 590; 357/41, 55; 307/475; 361/406, 774, 775, 777; 257/665; 371/27, 23

[56] References Cited

U.S. PATENT DOCUMENTS

| | | | |
|---|---|---|---|
| 4,694,403 | 5/1987 | Nomura | 364/488 |
| 4,831,497 | 5/1989 | Webster et al. | 361/406 |
| 4,896,272 | 1/1990 | Kurosawa | 364/491 |
| 5,197,015 | 3/1993 | Hartoog et al. | 364/490 |
| 5,198,986 | 3/1993 | Ikeda et al. | 364/489 |
| 5,202,841 | 4/1993 | Tani | 364/491 |
| 5,225,993 | 7/1993 | Iwatsuki et al. | 364/490 |
| 5,247,455 | 9/1993 | Yoshikawa | 364/490 |
| 5,247,456 | 9/1993 | Ohe et al. | 364/491 |
| 5,249,134 | 9/1993 | Oka | 364/491 |
| 5,282,146 | 1/1994 | Aihara et al. | 364/489 |

*Primary Examiner*—Kevin J. Teska
*Assistant Examiner*—Jacques H. Louis-Jacques
*Attorney, Agent, or Firm*—Oblon, Spivak, McClelland, Maier, & Neustadt

[57] ABSTRACT

A crosstalk verification device for preventing cross talk of an LSI layout pattern. An error extracting portion (17) which, referring to the contents of a design rule file (12) and a crosstalk noise reference voltage storing portion (18), processes coordinate data of an output wiring pattern in an output wiring pattern file (16) to determine a wire-to-wire capacitance of an overlap/-parallel portion between an output wire of a transistor prone to exert crosstalk influence and an output wire of a transistor susceptible to crosstalk. The error extracting portion (17) then calculates the magnitude of crosstalk noise as a function of the wire-to-wire capacitance to specify a portion in which the magnitude of crosstalk noise exceeds reference voltages. The specified coordinate data is applied as error information to an error file (19). The crosstalk verification device having such arrangements provides for automatic verification of the presence/absence of a portion in which there is a danger that crosstalk may occur.

16 Claims, 16 Drawing Sheets

CROSSTALK VERIFICATION DEVICE

BACKGROUND OF THE INVENTION

1. Field of the Invention

The present invention relates to a crosstalk verification device for automatically verifying the presence/absence of a portion in which there is a danger that crosstalk may occur for a layout pattern of a designed LSI.

2. Description of the Background Art

In an integrated circuit, a transistor of low output impedance has a large driving capability. The output waveform on an output wire of the transistor exhibits steep grades and consequently contains large high-frequency components. Thus the transistor of low output impedance is prone to exert the influence of crosstalk on other wires. On the other hand, a transistor of high output impedance is less capable of cancelling noise, if generated on an output wire thereof, because of its small driving capability. Thus the transistor of high output impedance is susceptible to crosstalk from other wires. Conventionally, a designer has visually confirmed the presence/absence of a portion in which there is a danger that the crosstalk may occur for a layout pattern of a designed LSI. The designer, while visually pursuing the layout pattern, has identified in the pattern the transistor of low output impedance which is prone to exert crosstalk influence and the transistor of high output impedance which is susceptible to crosstalk and has followed the output wires of the transistors to infer the combination and places of the output wires which are prone to cause the crosstalk.

However, the visual verification by the designer has the drawback of a seriously heavy burden on the designer. Another drawback is that the portion having the crosstalk occurrence danger is often overlooked because of its visual inference.

In view of scale expansion of the integrated circuits and size reduction of the patterns in future, the visual verification by the designer is expected to become more difficult to achieve correct crosstalk verification.

SUMMARY OF THE INVENTION

According to the present invention, a crosstalk verification device comprises: first providing means for providing layout pattern data specifying a layout pattern to be verified; second providing means for providing a design rule on the layout pattern to be verified; first storing means for storing a first reference on the size of a transistor prone to exert the influence of crosstalk and a second reference on the size of a transistor susceptible to crosstalk; first extracting means connected to the first and second providing means and the first storing means for processing the layout pattern data while referring to the design rule and the first and second references to extract, from the layout pattern data, data on output wiring patterns of a first transistor satisfying the first reference and a second transistor satisfying the second reference out of transistors in the layout pattern to be verified; second storing means for storing a third reference on the magnitude of crosstalk noise; second extracting means connected to the first extracting means and the second storing means for calculating a wire-to-wire capacitance of an overlap/parallel portion between output wires of the first and second transistors as a function of the data on the output wiring patterns to determine the magnitude of crosstalk noise produced when an output signal of the second transistor rises and falls as a function of the wire-to-wire capacitance, to extract the overlap/parallel portion as an error portion if the magnitude of crosstalk noise exceeds the third reference; and display means connected to the second extracting means for visually displaying the error portion.

In the crosstalk verification device, the first extracting means extracts from the layout pattern data the output wiring patterns of the transistor prone to exert crosstalk influence and the transistor susceptible to crosstalk. Then the second extracting means determines the wire-to-wire capacitance of the overlap/parallel portion between the output wiring patterns of the two transistors to calculate the magnitude of crosstalk noise produced when the output signal of the transistor susceptible to crosstalk rises and falls as a function of the wire-to-wire capacitance. The calculated magnitude of crosstalk noise, if exceeding the third reference, is extracted as the error portion. The display means visually displays the error portion. This affords the automatic verification of the crosstalk. The correct crosstalk verification is enabled when the scale of the integrated circuit is expanded or reduced.

In another aspect of the present invention, a crosstalk verification device comprises: first providing means for providing layout pattern data specifying a layout pattern to be verified; second providing means for providing a design rule on the layout pattern to be verified; storing means for storing a first reference on the size of a transistor prone to exert the influence of crosstalk and a second reference on the size of a transistor susceptible to crosstalk; first extracting means connected to the first and second providing means and the storing means for processing the layout pattern data while referring to the design rule and the first and second references to extract, from the layout pattern data, data on output wiring patterns of a first transistor satisfying the first reference and a second transistor satisfying the second reference out of transistors in the layout pattern to be verified; second extracting means connected to the first extracting means for specifying an output wiring pattern required to be subjected to crosstalk verification in accordance with a predetermined reference as a function of a time constant in an output wire of the first transistor having an overlap/parallel portion with an output wire of the second transistor from the data on the output wiring patterns to extract an equivalent circuit of the specified output wiring pattern as a circuit to be simulated; and simulation executing means connected to the second extracting means for executing a circuit simulation on the circuit to be simulated to perform crosstalk noise verification.

In the crosstalk verification device of the second aspect, the first extracting means extracts from the layout pattern data the output wiring patterns of the transistor prone to exert crosstalk influence and the transistor susceptible to crosstalk. Then the second extracting means determines the time constant in the output wire of the transistor prone to exert crosstalk influence which has the output wire of the transistor susceptible to crosstalk from the output wiring patterns of the two transistors to extract the portion to be subjected to the crosstalk verification as the circuit to be simulated as a function of the time constant in accordance with the predetermined reference. The simulation executing means performs the circuit simulation on the extracted circuit to be simulated. This affords the automatic verification of the crosstalk. The correct crosstalk verification is enabled when the scale of the integrated circuit is expanded or reduced.

In still another aspect of the present invention, a crosstalk verification device comprises: first providing means for providing layout pattern data specifying a layout pattern to be verified; second providing means for providing a design rule on the layout pattern to be verified; first storing means for storing a first reference on the size of a transistor prone to exert the influence of crosstalk and a second reference on the size of a transistor susceptible to crosstalk; first extracting means connected to the first and second providing means and the first storing means for processing the layout pattern data while referring to the design rule and the first and second references to extract, from the layout pattern data, data on output wiring patterns of a first transistor satisfying the first reference and a second transistor satisfying the second reference out of transistors in the layout pattern to be verified; second storing means for storing a third reference on the magnitude of crosstalk noise; third storing means for storing a fourth reference on the magnitude of crosstalk noise; second extracting means connected to the first extracting means and the second storing means for determining a wire-to-wire capacitance of an overlap/parallel portion between output wires of the first and second transistors as a function of the data on the output wiring patterns to determine the magnitude of crosstalk noise produced when an output signal of the second transistor rises and falls as a function of the wire-to-wire capacitance, to extract a circuit including the overlap/parallel portion and its peripheral portion as a circuit to be simulated if the magnitude of crosstalk noise exceeds the third reference; simulation executing means connected to the second extracting means for executing a circuit simulation on the circuit to be simulated to calculate a simulation-resultant crosstalk noise; third extracting means connected to the simulation executing means and the third storing means for extracting the overlap/parallel portion of the circuit to be simulated as an error portion if the magnitude of the simulation-resultant crosstalk noise exceeds the fourth reference; and display means connected to the third extracting means for visually displaying the error portion.

In the crosstalk verification device of the third aspect, the first extracting means extracts from the layout pattern data the output wiring patterns of the transistor prone to exert crosstalk influence and the transistor susceptible to crosstalk. The second extracting means determines the wire-to-wire capacitance of the overlap/parallel portion between the output wiring patterns of the two transistors to calculate the magnitude of crosstalk noise produced when the output signal of the transistor susceptible to crosstalk rises and falls as a function of the wire-to-wire capacitance. When the calculated magnitude of crosstalk noise exceeds the third reference, the equivalent circuit of the layout pattern including the overlap/parallel portion and its peripheral portion is extracted as the circuit to be simulated.

Then the simulation executing means performs the circuit simulation on the extracted circuit to be simulated, so that the simulation-resultant crosstalk noise is calculated. The third extracting means extracts the overlap/parallel portion of the circuit to be simulated as the error portion when the magnitude of simulation-resultant crosstalk noise exceeds the fourth reference.

The display means visually displays the error portion. This affords the automatic verification of the crosstalk. The correct crosstalk verification is enabled when the scale of the integrated circuit is expanded or reduced.

An object of the present invention is to provide a crosstalk verification device for automatically verifying the presence/absence of a portion in which there is a danger that crosstalk may occur for a layout pattern of an LSI.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
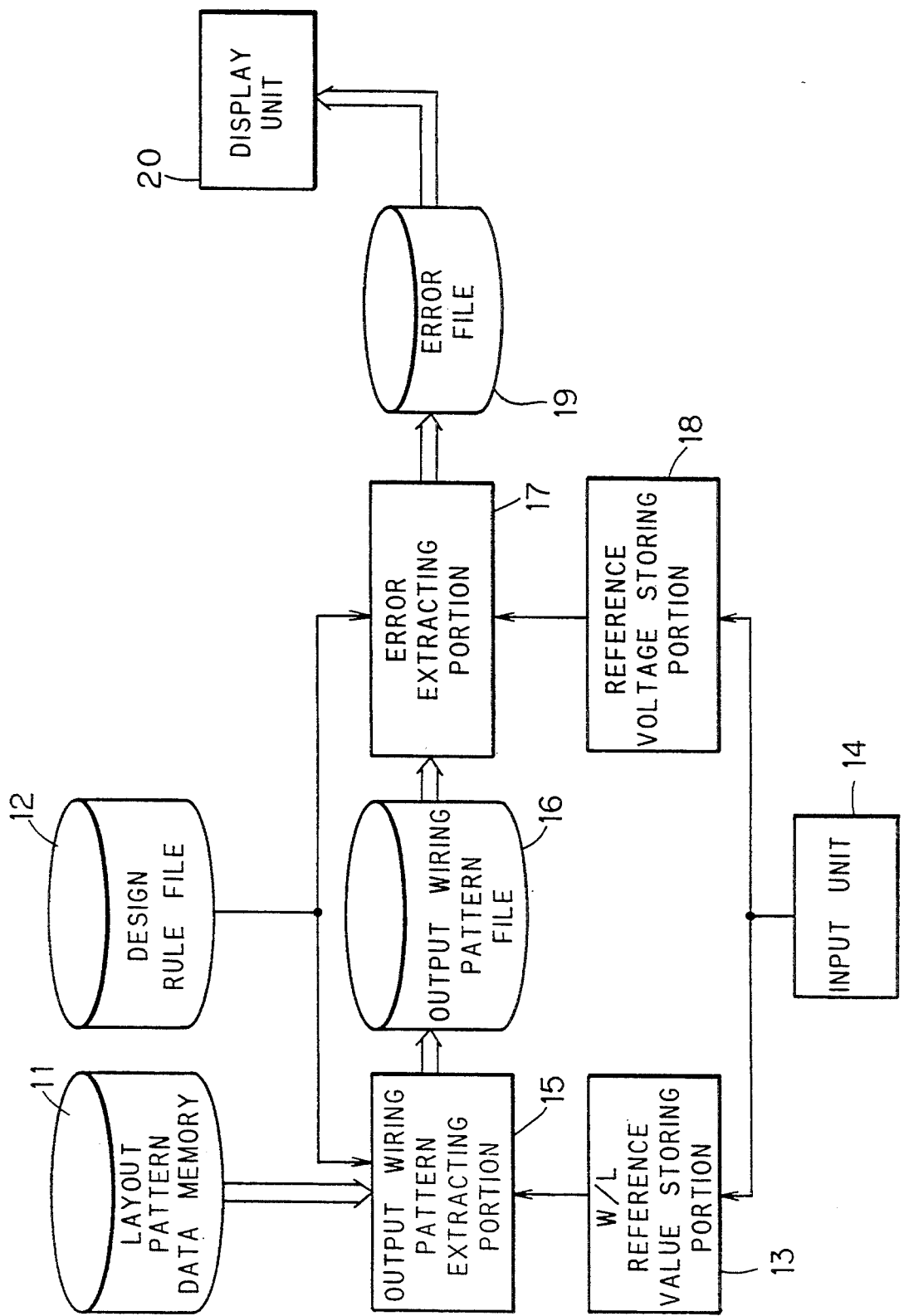
FIG. 1 is a block diagram of a crosstalk verification device according to a first preferred embodiment of the present invention.
Figure 2:
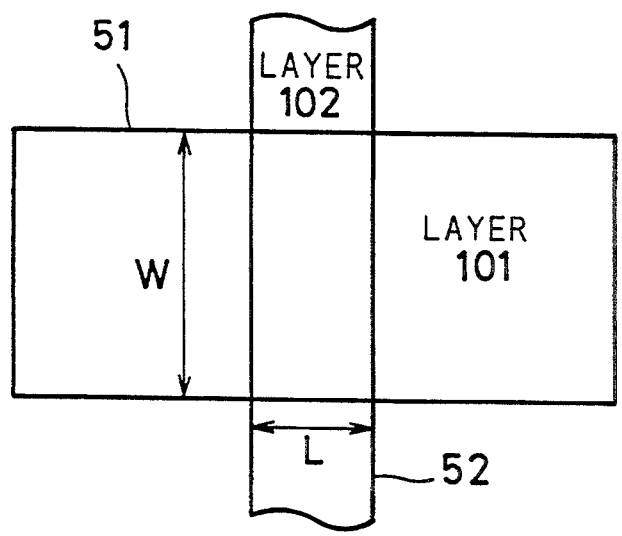
FIG. 2 is a plan view of one transistor portion in a layout pattern.

FIG. 1 is a block diagram of a crosstalk verification device according to a first preferred embodiment of the present invention. A layout pattern data memory 11 stores layout pattern data specifying a layout pattern to be verified. The layout pattern data includes such information as layers, coordinates and the like for respective graphic elements forming the layout pattern. FIG. 2 is a plan view of an exemplary transistor portion in the layout pattern. The transistor of FIG. 2 includes two graphic elements 51, 52 that intersect each other. In the layout pattern data, the graphic elements 51 and 52 are specified as layers 101 and 102, respectively, and the positional relation between the graphic elements 51 and 52 is specified by coordinate information indicative of a plurality of specific points of the graphic elements 51 and 52. The layer 101 corresponds to a pattern for production of source and drain regions of the transistor, and the layer 102 corresponds to a pattern for production of a gate region thereof.

Various rules are defined or described in a design rule file 12. The definitions or descriptions associated with the first preferred embodiment are as follows:

(i) the definition of a transistor and wiring in the layout pattern;
(ii) the definition of a gate length L and a gate width W of the transistor;
(iii) the definition of source and drain regions of the transistor;
(iv) the description indicative of an insulating film thickness, a wiring film thickness, and a dielectric constant of the insulating film;
(v) the description indicative of a distance between wires; and
(vi) the description of a parasitic capacitance and a parasitic resistance of the transistor.

Figure 3:
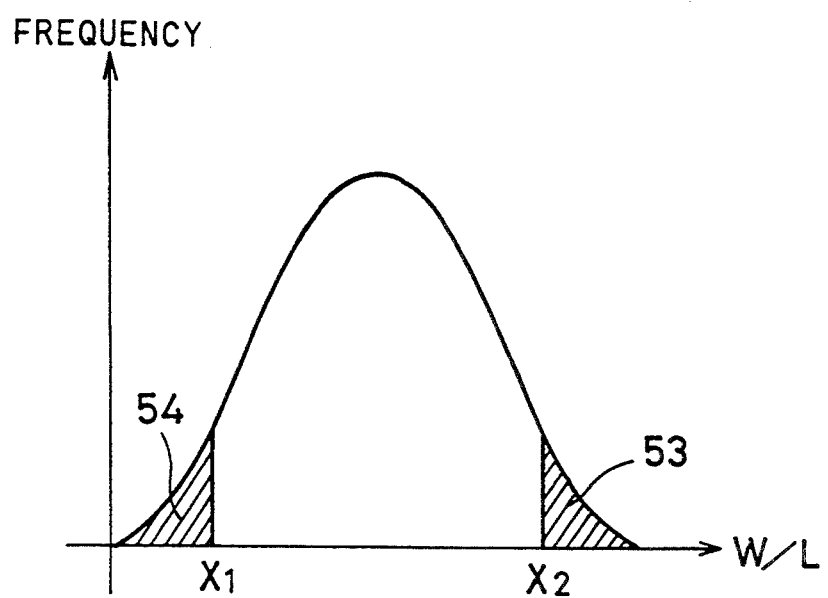
FIG. 3 is a graph showing an exemplary distribution of the size of all transistors in the layout pattern.

A W/L reference value storing portion 13 stores reference values $X_1$ and $X_2$ of a transistor size W/L inputted through an input unit 14. FIG. 3 is a graph showing an exemplary distribution of the size W/L of all transistors in the layout pattern. A transistor of low output impedance which is prone to exert the influence of crosstalk is included in a region 53 satisfying W/L>$X_2$. A transistor of high output impedance which is susceptible to crosstalk is included in a region 54 satisfying W/L<$X_1$. The reference values $X_1$, $X_2$ stored in the W/L reference value storing portion 13 serve as a reference for distinguishing the transistor prone to exert crosstalk influence and the transistor susceptible to crosstalk from the other transistors in the layout pattern.

An output wiring pattern extracting portion 15 processes the layout pattern data in the layout pattern data memory 11 while referring to the contents of the design rule file 12 and W/L reference value storing portion 13 to extract only the output wiring patterns of the transistor prone to exert crosstalk influence and the transistor susceptible to crosstalk. The extracted data is stored in an output wiring pattern file 16.

Figure 4:
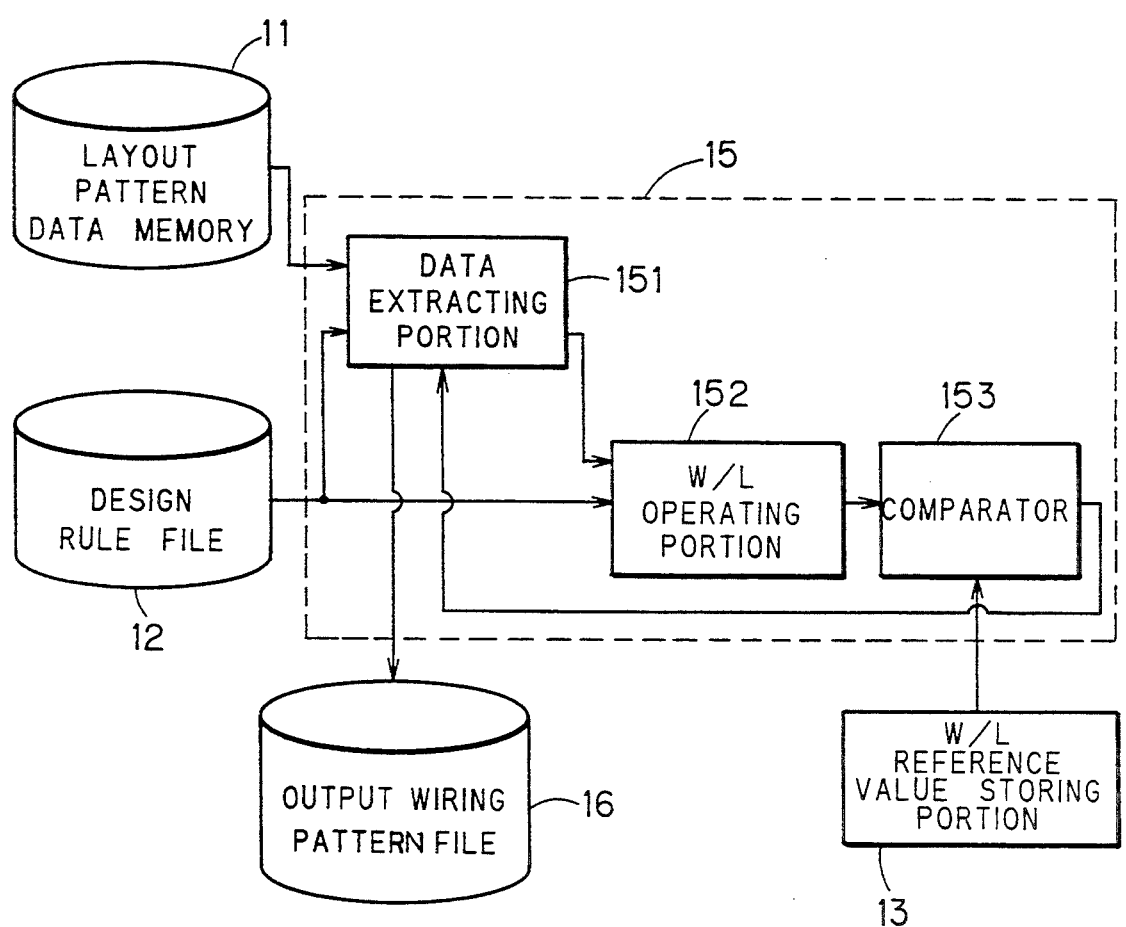
FIG. 4 is a detailed block diagram of an output wiring pattern extracting portion of the first preferred embodiment.

FIG. 4 is a detailed block diagram of the output wiring pattern extracting portion 15. The output wiring pattern extracting portion 15 comprises a data extracting portion 151, a W/L operating portion 152, and a comparator 153.

The data extracting portion 151 applies the definition (i) in the design rule file 12 to the layout pattern data stored in the layout pattern data memory 11 to identify a transistor in the layout pattern. The data extracting portion 151 then extracts the pattern data of the transistor to send the extracted data to the W/L operating portion 152. For example, the transistor of FIG. 2 in the layout pattern is identified by the description in the transistor definition (i) that "an overlap portion between the graphic element of the layer number 101 and the graphic element of the layer number 102 is a transistor". The data extracting portion 151 extracts the data on the layers and coordinates for the graphic elements forming the identified transistor from the layout pattern data to apply the extracted data to the W/L operating portion 152.

The W/L operating portion 152 applies the definition (ii) in the design rule file 12 to the applied data to calculate the transistor size W/L. The gate length L and gate width W of the transistor are determined, for example, by the description in the definition (ii) that "the length of the layer 102 intercepted by the layer 101 is W, and the width of the layer 102 intercepted by the layer 101 is L". Specifically, the coordinates of the intersection of the layers 101 and 102 are calculated, and the gate length L and gate width W are then calculated using the intersection coordinates in accordance with the definition (ii). The transistor size W/L is finally calculated from the ratio of the gate width W to the gate length L. The calculated transistor size W/L is given to the comparator 153.

The comparator 153 compares the transistor size W/L with the reference values $X_1$ and $X_2$ stored in the W/L reference value storing portion 13. The comparison result falls in one of the following cases:

$C_1$: W/L>$X_2$ $C_2$: $X_2 \geq$ W/L $\geq X_1$ $C_3$: W/L<$X_1$

The comparison result $C_1$, $C_2$ or $C_3$ is applied to the data extracting portion 151.

On receiving the comparison result $C_2$ from the comparator 153, the data extracting portion 151 does not extract new data on the previously identified transistor but shifts to the identification of another transistor in the layout pattern.

On receiving the comparison result $C_1$ or $C_3$ from the comparator 153, the data extracting portion 151 extracts new data on the previously identified transistor, that is, the coordinate data of the output wiring pattern of the transistor. The identification of an output wire is carried out as a function of the definition (iii). For example, the source and drain regions of the transistor of FIG. 2 are identified by the description in the definition (iii) that "regions of the layer 101 which are on opposite sides of the layer 102 are source and drain regions". All of the identified source and drain regions connected to neither the power supply, the GND, nor the external input terminals of the LSI are determined as output terminals of the transistor. Since the information referred to as a text is added to the regions of the layout pattern connected to the power supply, the GND, and the external input terminals of the LSI in the layout pattern data, whether or not the identified source and drain regions are connected to the power supply, the GND, and the external input terminals of the LSI is found by referring to the information.

The coordinate data of the wiring pattern (output wiring pattern) connected to the source and drain regions identified as the output terminals in the data extracting portion 151 is extracted from the layout pattern data by the application of the wiring definition (i), and the extracted data is stored in the output wiring pattern file 16. To the coordinate data of the output wiring pattern stored in the output wiring pattern file 16 is added supplementary data for identifying whether it corresponds to the comparison result $C_1$ (the output wire of the relatively large-sized transistor prone to exert crosstalk influence) or to the comparison result $C_3$ (the output wire of the relatively small-sized transistor susceptible to crosstalk). In place of the addition of the supplementary data, the coordinate data corresponding to the comparison results $C_1$ and $C_3$ may be stored in different regions in the output wiring pattern file 16 for distinction therebetween.

Referring again to FIG. 1, an error extracting portion 17 processes the coordinate data of the output wiring pattern in the output wiring pattern file 16 while referring to the contents of the design rule file 12 and crosstalk noise reference voltages stored in a reference voltage storing portion 18, to determine a wire-to-wire capacitance of an overlap/parallel portion between the output wire of the transistor prone to exert crosstalk influence and the output wire of the transistor susceptible to crosstalk. The error extracting portion 17 then calculates the magnitude of the crosstalk noise as a function of the wire-to-wire capacitance to specify a portion in which the magnitude of the crosstalk noise is not less than the reference voltages. The specified coordinate data is given as error information to an error file 19.

Figure 5:
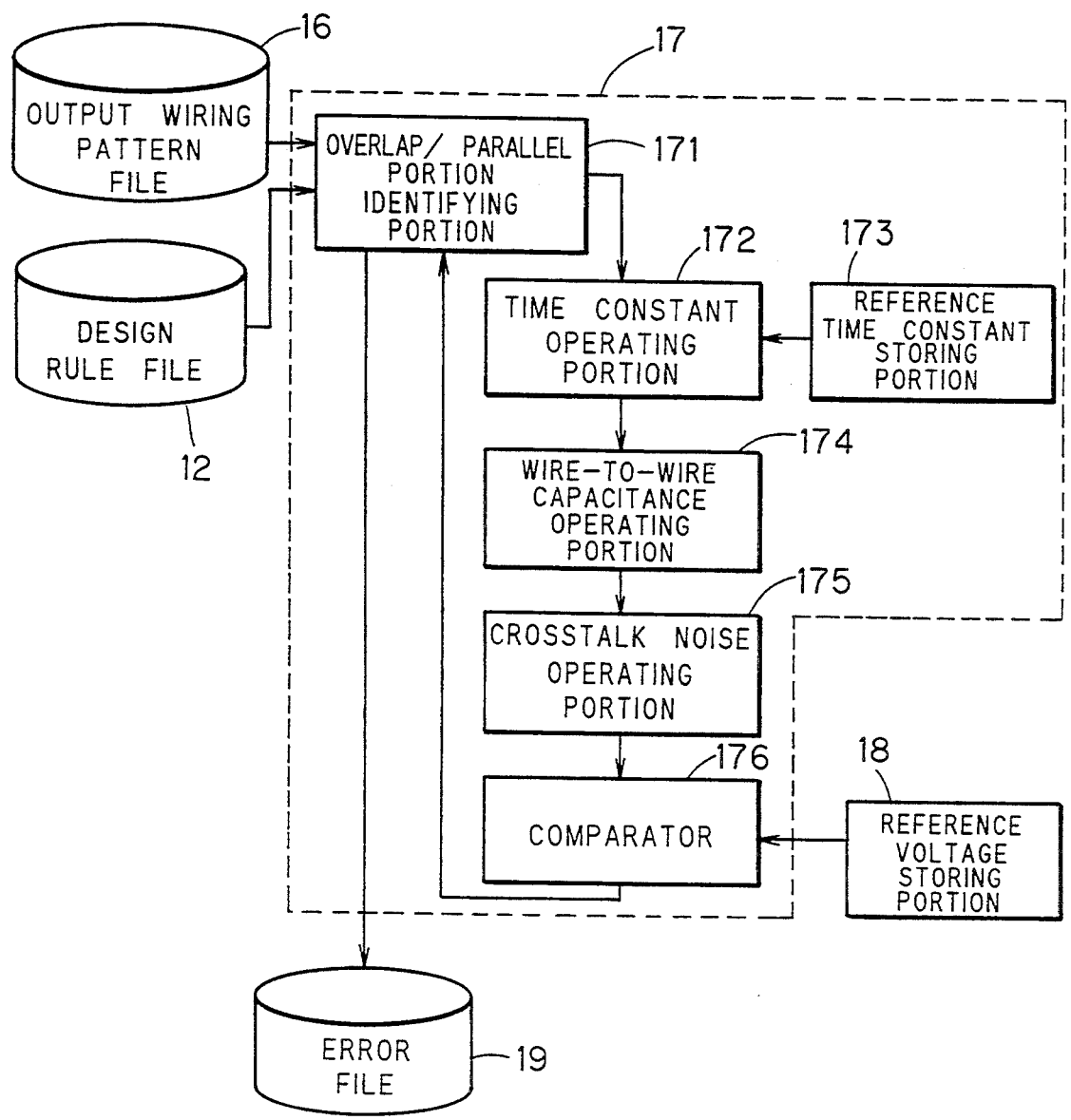
FIG. 5 is a detailed block diagram of an error extracting portion of the first preferred embodiment.

FIG. 5 is a detailed block diagram of the error extracting portion 17. The error extracting portion 17 comprises an overlap/parallel portion identifying portion 171, a time constant operating portion 172, a reference time constant storing potion 173, a wire-to-wire capacitance operating portion 174, a crosstalk noise operating portion 175, and a comparator 176.

Figure 6:
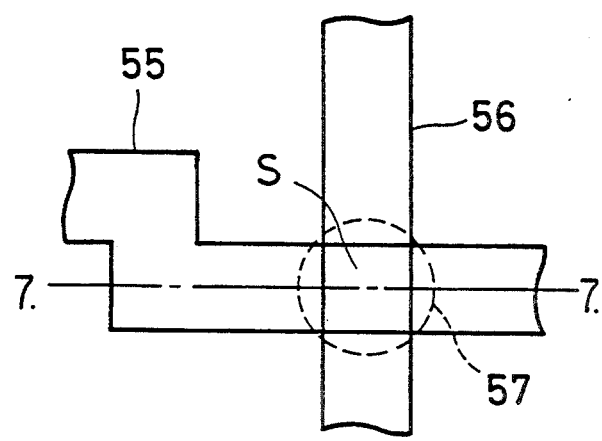
FIG. 6 is a plan view of an overlap portion between output wires.
Figure 7:
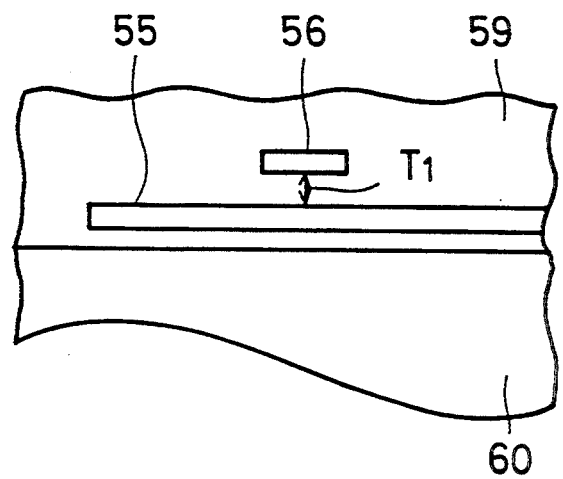
FIG. 7 is a cross-sectional view taken along the line A—A of FIG. 6.
Figure 8:
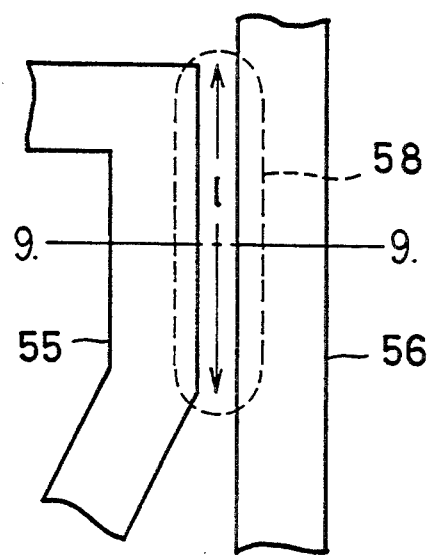
FIG. 8 is a plan view of a parallel portion between output wires.
Figure 9:
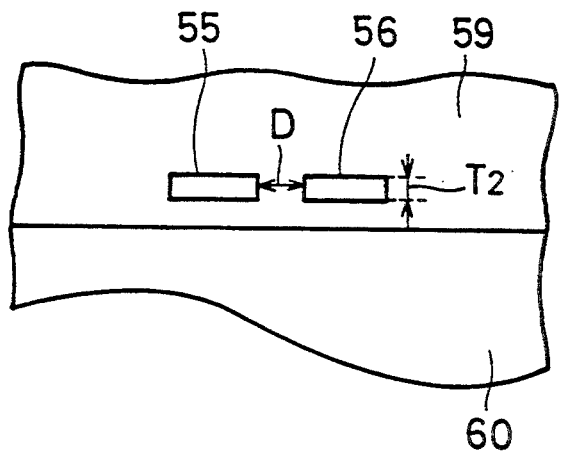
FIG. 9 is a cross-sectional view taken along the line B—B of FIG. 8.

The overlap/parallel portion identifying portion 171 identifies an overlap portion 57 and a parallel portion 58 between an output wire 55 of the transistor prone to exert crosstalk influence and an output wire 56 of the transistor susceptible to crosstalk as shown in FIGS. 6 and 8 and determines a distance D between the wires in the parallel portion 58 as a function of the coordinate data of the output wiring pattern stored in the output wiring pattern file 16. The overlap/parallel portion identifying portion 171 also refers to the description of the definition (v) in the design rule file 12 to regard only the parallel portion 58 in which the distance D between the wires is approximate to a minimum indicated by the definition (v) as an effective parallel portion 58. The overlap/parallel portion identifying portion 171 applies coordinate data for specifying the overlap portion 57 and the effective parallel portion 58 to the time constant operating portion 172. FIG. 7 is a cross-sectional view taken along the line A—A of FIG. 6. FIG. 9 is a cross-sectional view taken along the line B—B of FIG. 8.

The time constant operating portion 172 refers to the description of the definition (vi) in the design rule file 12 provided through the overlap/parallel portion identifying portion 171 to calculate an output load capacitance $C_n$ of the transistor prone to exert crosstalk influence which is extracted from the overlap/parallel portion identifying portion 171 and has the overlap/parallel portion. The time constant operating portion 172 calculates a time constant $\tau$ in the output wire of the transistor prone to exert crosstalk influence as a function of the calculated output load capacitance $C_n$ from the following equation:

$$\tau = R_{tr}C_n \quad (1)$$

where $R_{tr}$ is an on-resistance of the transistor. The on-resistance $R_{tr}$ is easily calculated by determining the transistor size W/L, referring to the design rule file 12. The time constant $\tau$ in the output wire of the transistor represents the steepness of the rising or falling of an output voltage developed in the output wire of the transistor. The smaller the time constant $\tau$ is, the more steeply the voltage rises or falls so that the transistor is more prone to exert crosstalk influence.

The time constant operating portion 172 compares the time constant $\tau$ calculated from Equation (1) with a reference time constant previously stored in the reference time constant storing portion 173 to extract the coordinate data of the overlap/parallel portion of the output wire of the transistor having the time constant $\tau$ that is smaller than the reference time constant. The extracted coordinate data is given to the wire-to-wire capacitance operating portion 174. The storage of the reference time constant in the reference time constant storing portion 173 may be set by a user by way of the input unit 14.

The wire-to-wire capacitance operating portion 174 calculates the area S of the overlap portion (FIG. 6) from the coordinate data given from the time constant operating portion 172 to calculate a capacitance CP1 of the overlap portion as a function of the area S from Equation (2). At the same time, the wire-to-wire capacitance operating portion 174 calculates a capacitance CP2 of the parallel portion from, for example, Equation (3) using an effective length l (FIG. 8) of the parallel portion and the distance D between the wires (FIG. 9) in the effective parallel portion 58 from the coordinate data given from the time constant operating portion 172.

$$CP1 = \epsilon S/T_1 \quad (2)$$

$$CP2 = \epsilon T_2 l/D \quad (3)$$

where $T_1$ is the thickness of an insulating film 59 between the wires 55 and 56 which overlap in the overlap portion 57 in Equation (2) (FIGS. 6 and 7), and $T_2$ is the length of an overlap in the vertical direction between the wires 55 and 56 parallel to each other (FIG. 9). The wire-to-wire capacitance operating portion 174 calculates the wire-to-wire capacitance of the overlap portion and effective parallel portion to apply the capacitance to the crosstalk noise operating portion 175.

The crosstalk noise operating portion 175 calculates maximum and minimum values $V_r$ and $V_f$ of the crosstalk noise produced in the output wire of the transistor susceptible to crosstalk when the output voltage in the output wire of the transistor prone to exert crosstalk influence rises and falls, respectively, to give the maximum and minimum values $V_r$ and $V_f$ to the comparator 176. The maximum and minimum values $V_r$ and $V_f$ of the crosstalk noise are expressed, for example, as:

$$V_r = V_{DD}(C_{INT}/(C_{INT} + C_{n+1})) \quad (4)$$

$$V_f = V_{DD}(C_{n+1}/(C_{INT} + C_{n+1})) \quad (5)$$

where $V_{DD}$ is a power supply voltage, $C_{INT}$ is the wire-to-wire capacitance, and $C_{n+1}$ is a drain capacitance of a transistor connected to the output wire of the transistor susceptible to crosstalk. The drain capacitance is easily obtained by referring to the definition (vi) in the design rule file 12 provided through the portions 171, 172 and 174.

Figure 10:
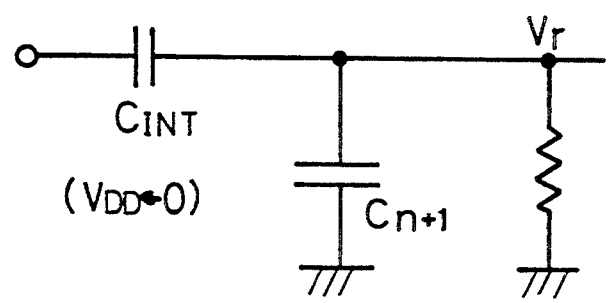
FIGS. 10 and 11 are schematic circuit diagrams for crosstalk noise calculation, respectively.
Figure 11:
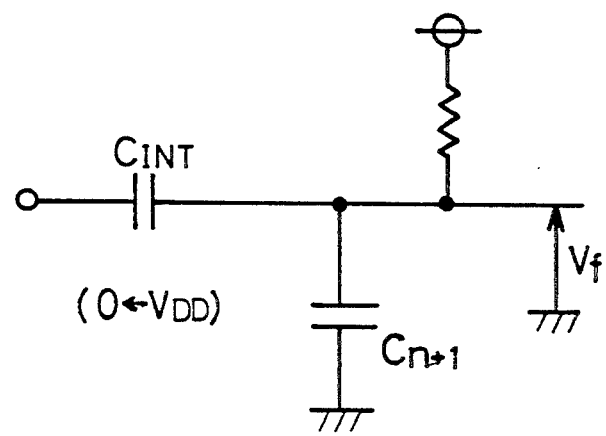

FIGS. 10 and 11 are schematic circuit diagrams for calculation of the crosstalk noise from the output wire of the transistor prone to exert crosstalk influence. FIG. 10 is a schematic circuit diagram when the voltage rises, and FIG. 11 is a schematic circuit diagram when the voltage falls.

Referring to FIG. 10, when the output voltage rises from zero to $V_{DD}$, Equation (6) is derived from the relation Q=CV.

$$C_{INT} \cdot V_{DD} = (C_{INT} + C_{n+1}) \cdot V_r \quad (6)$$

Thus Equation (4) is derived from Equation (6).

Referring to FIG. 11, when the output voltage falls from $V_{DD}$ to zero, Equation (7) is similarly derived.

$$C_{n+1} \cdot V_{DD} = (C_{n+1} + C_{INT}) \cdot V_f \quad (7)$$

Thus Equation (5) is derived from Equation (7).

The crosstalk noise reference voltages are previously stored in the reference voltage storing portion 18 from the input unit 14. The comparator 176 compares the maximum and minimum values $V_r$ and $V_f$ of the crosstalk noise calculated in the crosstalk noise operating portion 175 with the respective reference voltages stored in the reference voltage storing portion 18 to apply the resultant error signal to the overlap/parallel portion identifying portion 171. When the maximum and minimum values exceed the respective reference values, there is a highly probable danger that the crosstalk may occur. In response to the error signal, the overlap/parallel portion identifying portion 171 outputs the previously determined coordinate data for specifying the overlap portion 57 and effective parallel portion 58 to the error file 19.

Figure 12:
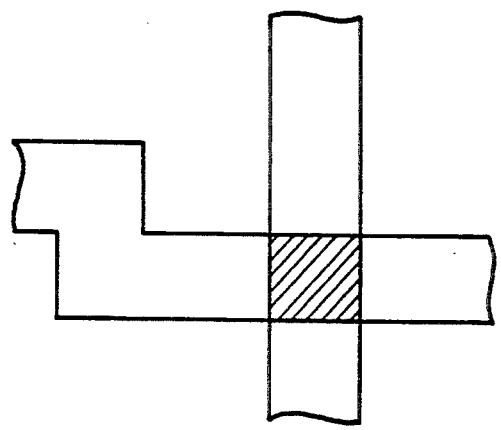
FIGS. 12 and 13 show exemplary error display on the layout pattern, respectively.
Figure 13:
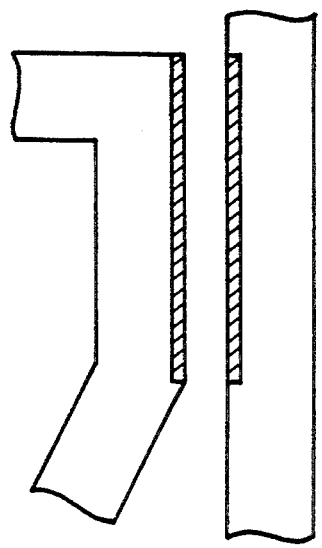

A display unit 20 receives the layout pattern data stored in the layout pattern data memory 11 and the coordinate data stored in the error file 19 to display a layout pattern in which the error portion is emphasized for ease of visual recognition as shown in FIGS. 12 and 13.

Figure 14:
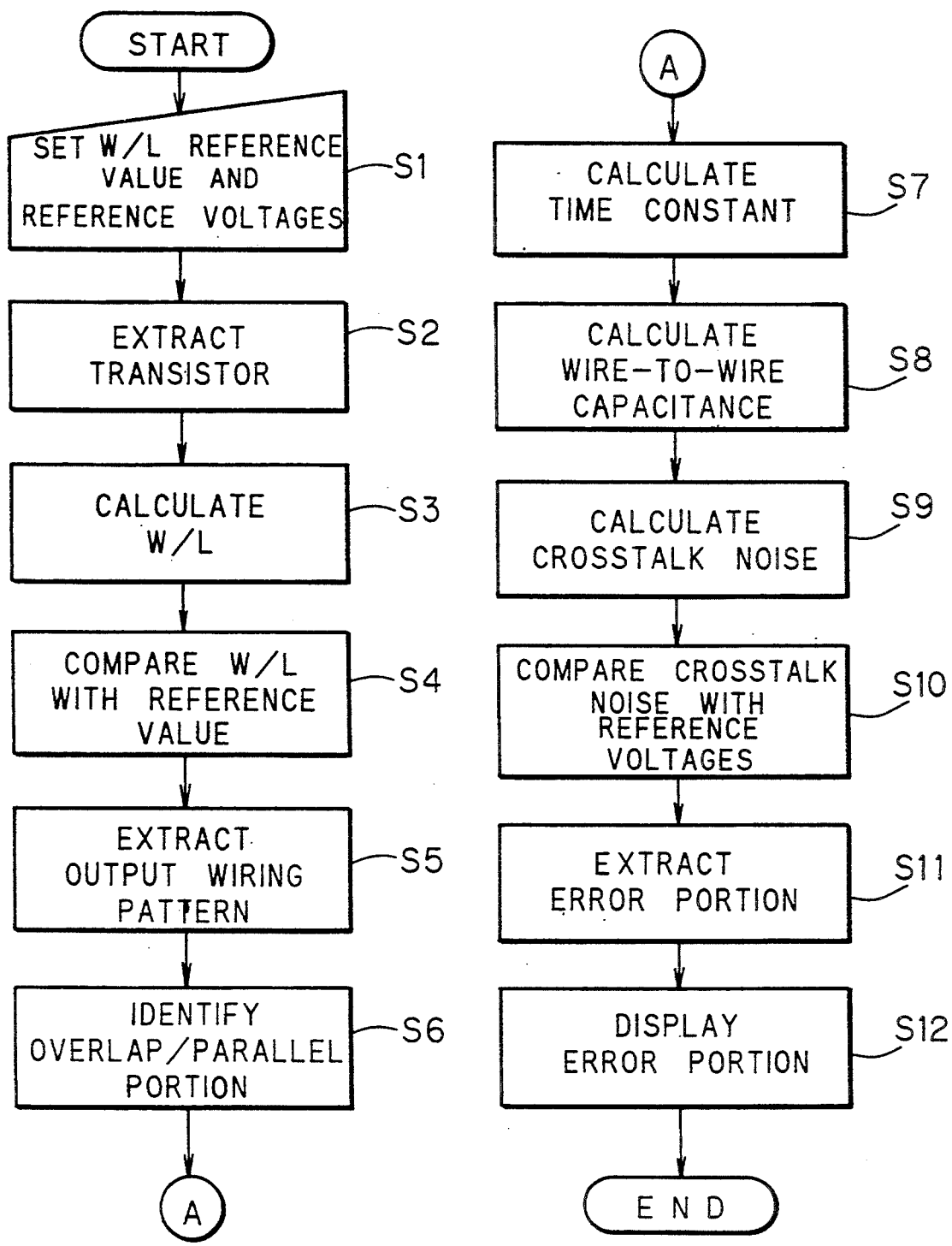
FIG. 14 is a flow chart of procedure when the function of the crosstalk verification device of the first preferred embodiment is achieved by means of a computer.

FIG. 14 is a flow chart of procedure when the function of the crosstalk verification device of FIG. 1 is achieved by means of a well-known computer including a storage device and a CPU. A program for the procedure is stored in the storage device. The CPU operates in accordance with the program to thereby achieve the function of the extracting portions 15 and 17. The storage device also functions as the memory 11, the files 12, 16, 19 and the storing portions 13, 18, 173.

In the step S1, the W/L reference value and the reference voltages are stored in the W/L reference value storing portion 13 and the reference voltage storing portion 18, respectively, by means of the input unit 14.

In the step S2, the transistor in the layout pattern stored in the layout pattern data memory 11 is identified by the reference to the description of the definition (i) in the design rule file 12, and the pattern data of the transistor is extracted.

In the step S3, the definition (ii) in the design rule file 12 is applied to the pattern data of the extracted transistor to thereby calculate the transistor size W/L. In the step S4, the transistor size W/L is compared with the reference value stored in the W/L reference value storing portion 13 to thereby identify the transistor prone to exert crosstalk influence and the transistor susceptible to crosstalk.

In the step S5, the coordinate data of the output wiring patterns of the transistor prone to exert crosstalk influence and the transistor susceptible to crosstalk are extracted from the layout pattern data stored in the layout pattern data memory 11. The extracted coordinate data are stored in the output wiring pattern file 16 such that the data related to the transistor susceptible to crosstalk is enabled to be identified.

In the step S6, the overlap portion 57 (FIG. 6) and the parallel portion 58 (FIG. 8) between the output wire 55 of the transistor prone to exert crosstalk influence and the output wire 56 of the transistor susceptible to crosstalk are identified as a function of the coordinate data stored in the output wiring pattern file 16. Only the parallel portion 58 in which the distance D between the wires is within the predetermined range described in the definition (v) in the design rule file 12 is regarded as effective.

Calculated in the step S7 is the output load capacitance of the transistor prone to exert crosstalk influence which has the overlap portion 57 (FIG. 6) and the parallel portion 58 (FIG. 9) in its output wire. The time constant $\tau$ in the output wire of the transistor prone to exert crosstalk influence is determined by the application of Equation (1) from the calculated output load capacitance. Then, extracted is only the coordinate data of the overlap/parallel portion of the output wire of the transistor having the time constant that is smaller than the reference time constant stored in the reference time constant storing portion 173.

In the step S8, the wire-to-wire capacitance of the overlap/parallel portion extracted in the step S7 is calculated from Equation (2) or (3). When a plurality of overlap portions or parallel portions are present, the wire-to-wire capacitances for the respective portions are calculated and then the sum of the capacitances is determined.

The maximum and minimum values of the crosstalk noise in the output wire of the transistor susceptible to crosstalk at the time of rising and falling are calculated from Equations (4) and (5), respectively, in the step S9.

In the step S10, the maximum and minimum values of the crosstalk noise provided in the step S9 are compared with the respective reference voltages stored in the reference voltage storing portion 18. The crosstalk noise, if exceeding the reference voltages, is judged as the error portion as a function of the comparison result. In the step S11, the coordinate data of the error portion (i.e., the overlap portion 57 (FIG. 6) and the effective parallel portion 58 (FIG. 8)) is extracted. The extracted coordinate data is stored in the error file 19.

In the step S12, the error portion is displayed on the layout pattern by the display unit 20 as a function of the coordinate data stored in the error file 19.

The crosstalk verification device of the first preferred embodiment selects the transistor having the highly probable danger of crosstalk occurrence as a function of the time constant $\tau$ in the output wire of the transistor prone to exert crosstalk influence and calculates the output wire-to-wire capacitance of the selected transistor. The verification of the crosstalk noise calculated as a function of the output wire-to-wire capacitance permits the presence/absence of the portion having the crosstalk occurrence danger to be correctly verified.

Figure 15:
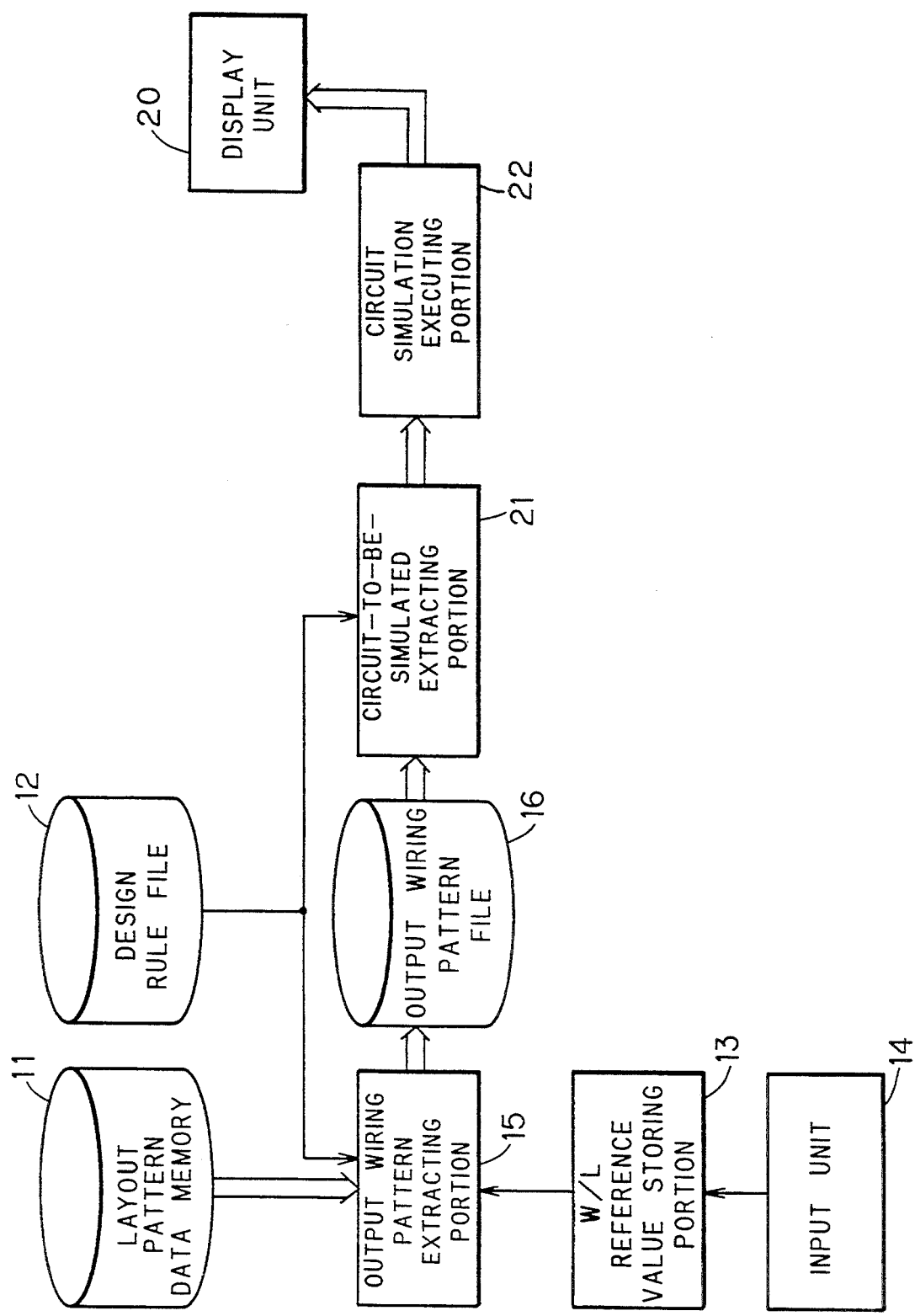
FIG. 15 is a block diagram of the crosstalk verification device according to a second preferred embodiment of the present invention.

FIG. 15 is a block diagram of the crosstalk verification device according to a second preferred embodiment of the present invention. The second preferred embodiment differs from the first preferred embodiment shown in FIG. 1 in that the device of the second preferred embodiment comprises a circuit-to-be-simulated extracting portion 21 and a circuit simulation executing portion 22 and, accordingly, in the connection of the portions 21, 22 to their peripheral portions. Only the differences will be described hereinafter, and the description of the other components identical with those of the first preferred embodiment will be omitted herein.

The circuit-to-be-simulated extracting portion 21 processes the coordinate data of the output wiring pattern in the output wiring pattern file 16 while referring to the contents of the design rule file 12, to thereby extract an equivalent circuit of the output wiring pattern including the output wire of the transistor susceptible to crosstalk, the overlap/parallel portion and its peripheral portion as a circuit to be simulated. The extracted circuit data is transmitted to the circuit simulation executing portion 22.

Figure 16:
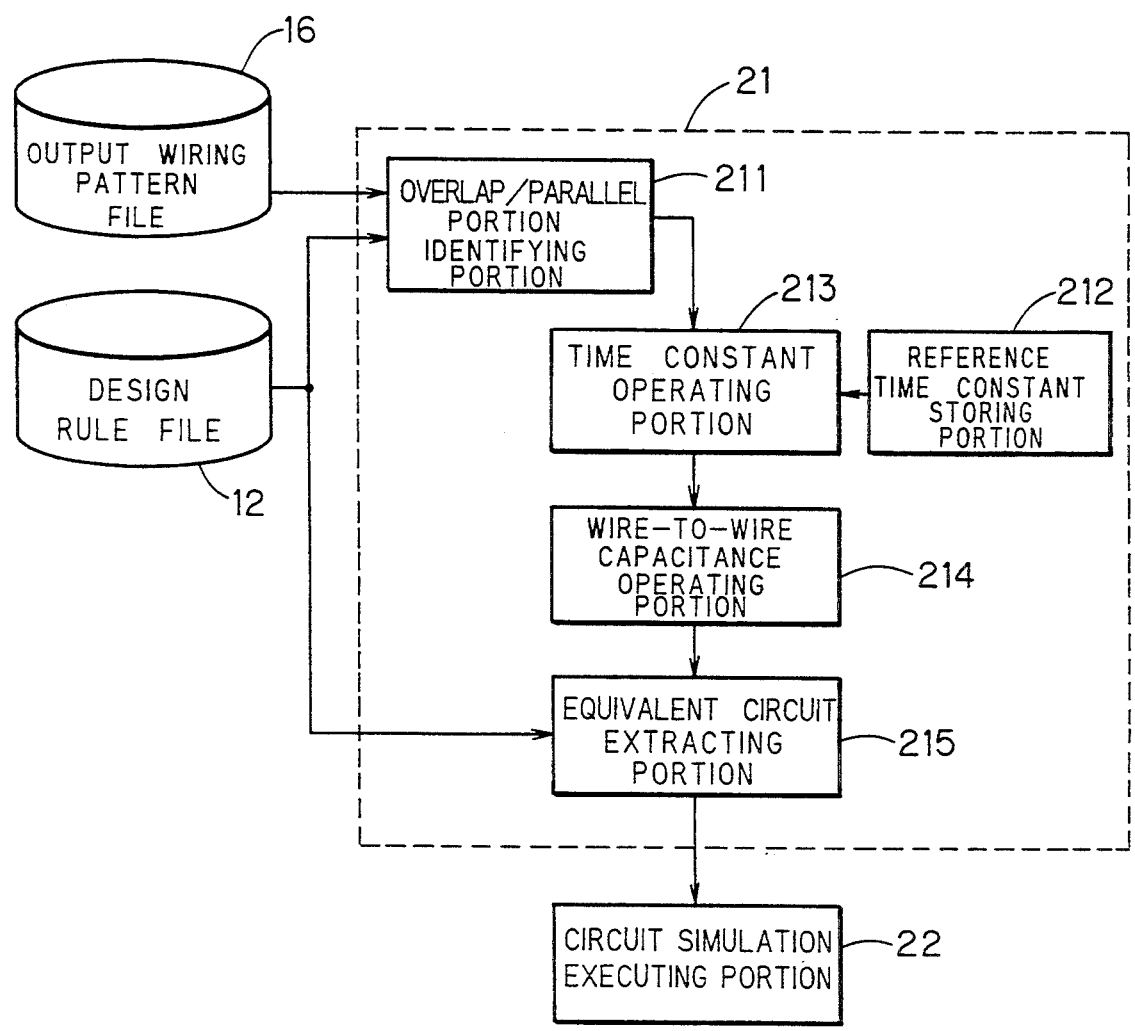
FIG. 16 is a detailed block diagram of a circuit-to-be-simulated extracting portion of the second preferred embodiment.

FIG. 16 is a detailed block diagram of the circuit-to-be-simulated extracting portion 21. The circuit-to-be-simulated extracting portion 21 comprises an overlap/parallel portion identifying portion 211, a reference time constant storing portion 212, a time constant operating portion 213, a wire-to-wire capacitance operating portion 214, and an equivalent circuit extracting portion 215.

In the same fashion as the overlap/parallel portion identifying portion 171 of the first preferred embodiment, the overlap/parallel portion identifying portion 211 identifies the overlap portion 57 and the parallel portion 58 between the output wire 55 of the transistor prone to exert crosstalk influence and the output wire 56 of the transistor susceptible to crosstalk as shown in FIGS. 6 and 8 and determines the distance D between the wires in the parallel portion 58 as a function of the coordinate data of the output wiring pattern stored in the output wiring pattern file 16. The overlap/parallel portion identifying portion 211 also refers to the description of the definition (v) in the design rule file 12 to regard only the parallel portion 58 in which the distance D is indicated by the definition (v) as the effective parallel portion 58. The overlap/parallel portion identifying portion 211 applies the coordinate data for specifying the overlap portion 57 and the effective parallel portion 58 to the time constant operating portion 213.

The time constant operating portion 213, referring to the description of the definition (vi) in the design rule file 12 provided through the overlap/parallel portion identifying portion 211, calculates the output load capacitance $C_n$ of the transistor prone to exert crosstalk influence which is extracted from the overlap/parallel portion identifying portion 211 and has the overlap/parallel portion. The time constant operating portion 213 determines the time constant $\tau$ in the output wire of the transistor prone to exert crosstalk influence from Equation (1) using the calculated output load capacitance $C_n$.

The time constant operating portion 213 compares the time constant $\tau$ calculated from Equation (1) with the reference time constant previously stored in the reference time constant storing portion 212 to extract the coordinate data of the overlap/parallel portion of the output wire of the transistor having the time constant $\tau$ that is smaller than the reference time constant. The extracted coordinate data is given to the wire-to-wire capacitance operating portion 214. The storage of the reference time constant in the reference time constant storing portion 212 may be set by the user by way of the input unit 14 as described in the first preferred embodiment.

In the same fashion as the wire-to-wire capacitance operating portion 174 of the first preferred embodiment, the wire-to-wire capacitance operating portion 214 calculates the area S of the overlap portion (FIG. 6) from the coordinate data extracted from the time constant operating portion 212 to calculate the capacitance CP1 of the overlap portion as a function of the area S from Equation (2). At the same time, the wire-to-wire capacitance operating portion 214 calculates the capacitance CP2 of the parallel portion from Equation (3) using the effective length l (FIG. 8) of the parallel portion and the distance D between the wires (FIG. 9) in the effective parallel potion 58 from the coordinate data given from the time constant operating portion 213.

The equivalent circuit extracting portion 215 refers to the design rule file and extracts the equivalent circuit of the layout pattern including the overlap/parallel portion extracted from the time constant operating portion 213 and its peripheral portion as the circuit to be simulated. The extracted circuit data is applied to the circuit simulation executing portion 22. The equivalent circuit of the layout pattern including the overlap/parallel portion and its peripheral portion represents a circuit including at least the transistor susceptible to crosstalk which has the overlap/parallel portion, the transistor prone to exert crosstalk influence, and all of the devices connected to the output wires of these transistors.

On receipt of the circuit-to-be-simulated data extracted from the equivalent circuit extracting portion 215, the circuit simulation executing portion 22 refers to the wire-to-wire capacitance obtained from the wire-to-wire capacitance operating portion 214 to execute the circuit simulation on the circuit to be simulated. The circuit simulation executing portion 22 then obtains the crosstalk noise waveforms to carry out the crosstalk verification.

Figure 17:
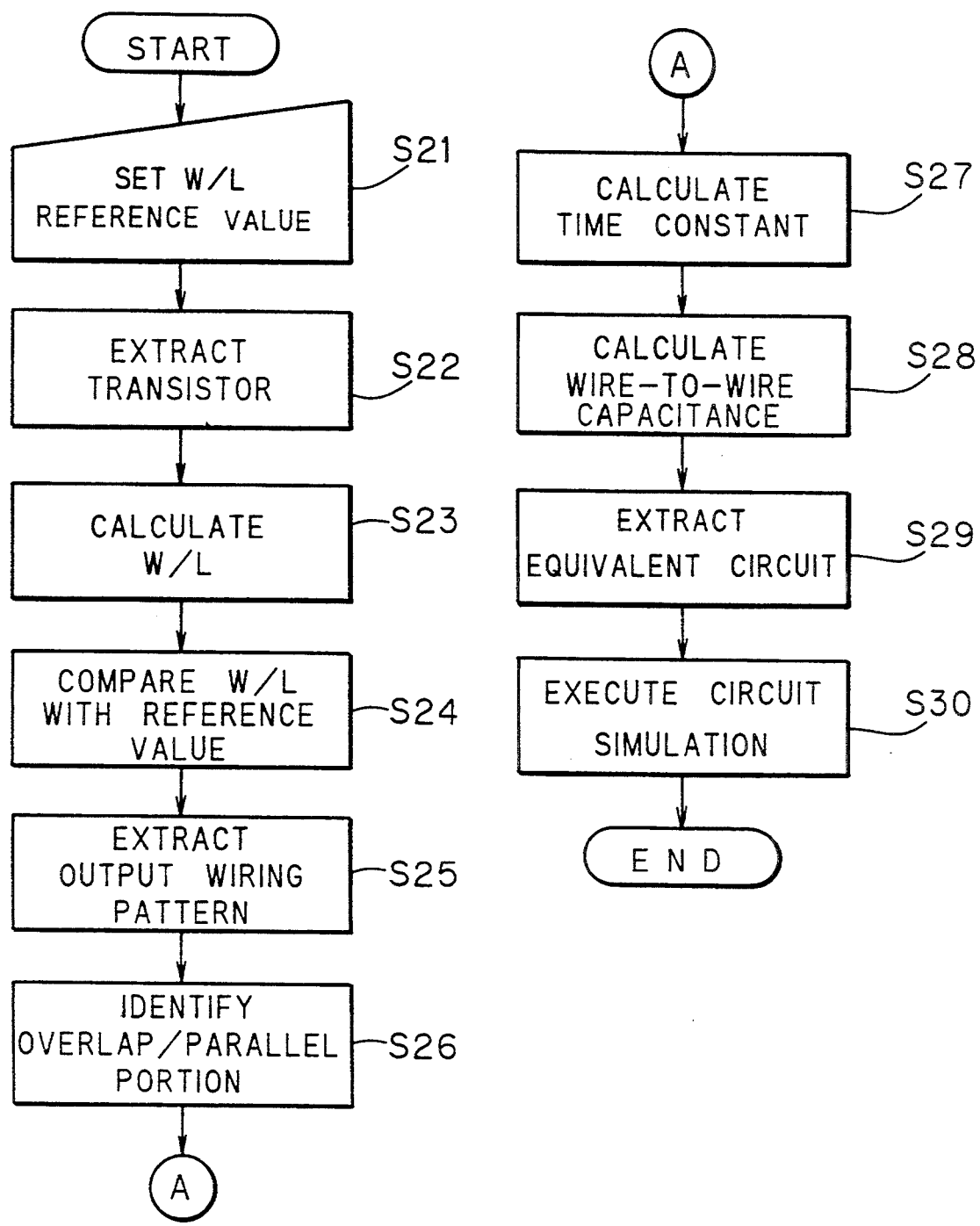
FIG. 17 is a flow chart of procedure when the function of the crosstalk verification device of the second preferred embodiment is achieved by means of the computer.

FIG. 17 is a flow chart of procedure when the function of the crosstalk verification device of FIG. 15 is achieved by means of the well-known computer including the storage device and the CPU. The program for the procedure is stored in the storage device. The CPU operates in accordance with the program to thereby achieve the function of the extracting portions 15 and 21. The storage device also functions as the memory 11, the files 12, 16, and the storing portions 13, 212.

In the step S21, the W/L reference value is stored in the W/L reference value storing portion 13 by means of the input unit 14.

In the step S22, the transistor in the layout pattern stored in the layout pattern data memory 11 is identified by the reference to the description of the definition (i) in the design rule file 12, and the pattern data of the transistor is extracted.

In the step S23, the definition (ii) in the design rule file 12 is applied to the pattern data of the extracted transistor to thereby calculate the transistor size W/L. In the step S24, the transistor size W/L is compared with the reference value stored in the W/L reference value storing portion 13 to thereby identify the transistor prone to exert crosstalk influence and the transistor susceptible to crosstalk.

In the step S25, the coordinate data of the output wiring patterns of the transistor prone to exert crosstalk influence and the transistor susceptible to crosstalk are extracted from the layout pattern data stored in the layout pattern data memory 11. The extracted coordinate data are stored in the output wiring pattern file 16 such that the coordinate data related to the transistor susceptible to crosstalk is enabled to be identified.

In the step S26, the overlap portion 57 (FIG. 6) and the parallel portion 58 (FIG. 8) between the output wire 55 of the transistor prone to exert crosstalk influence and the output wire 56 of the transistor susceptible to crosstalk are identified as a function of the coordinate data stored in the output wiring pattern file 16. Only the parallel portion 58 in which the distance D between the wires is within the predetermined range described in the definition (v) in the design rule file 12 is regarded as effective.

Calculated in the step S27 is the output load capacitance of the transistor prone to exert crosstalk influence which has the overlap portion 57 (FIG. 6) and the parallel portion 58 (FIG. 9) in its output wire. The time constant $\tau$ in the output wire of the transistor prone to exert crosstalk influence is determined by the application of Equation (1) from the calculated output load capacitance. Then, extracted is only the coordinate data of the overlap/parallel portion of the output wire of the transistor having the time constant that is smaller than the reference time constant stored in the reference time constant storing portion 212.

In the step S28, the wire-to-wire capacitance of the overlap/parallel portion extracted in the step S27 is calculated from Equation (2) or (3). When a plurality of overlap portions and parallel portions are present, the wire-to-wire capacitances for the respective portions are calculated and then the sum of the capacitances is determined.

In the step S29, the equivalent circuit of the layout pattern including the overlap/parallel portion extracted in the step S27 and its peripheral portion is extracted as the circuit to be simulated. The information for extraction of the equivalent circuit is stored in the design rule file 12.

In the step S30, the circuit simulation is carried out on the equivalent circuit provided in the step S29, while referring to the wire-to-wire capacitance provided in the step S28, so that the crosstalk waveforms are provided.

The crosstalk verification device of the second preferred embodiment selects the transistor having the highly probable danger of crosstalk occurrence by means of the time constant $\tau$ in the output wire of the transistor prone to exert crosstalk influence. The crosstalk noise of the selected transistor is verified by the execution of the circuit simulation, whereby the presence/absence of the portion having the crosstalk occurrence danger is verified efficiently.

Figure 18:
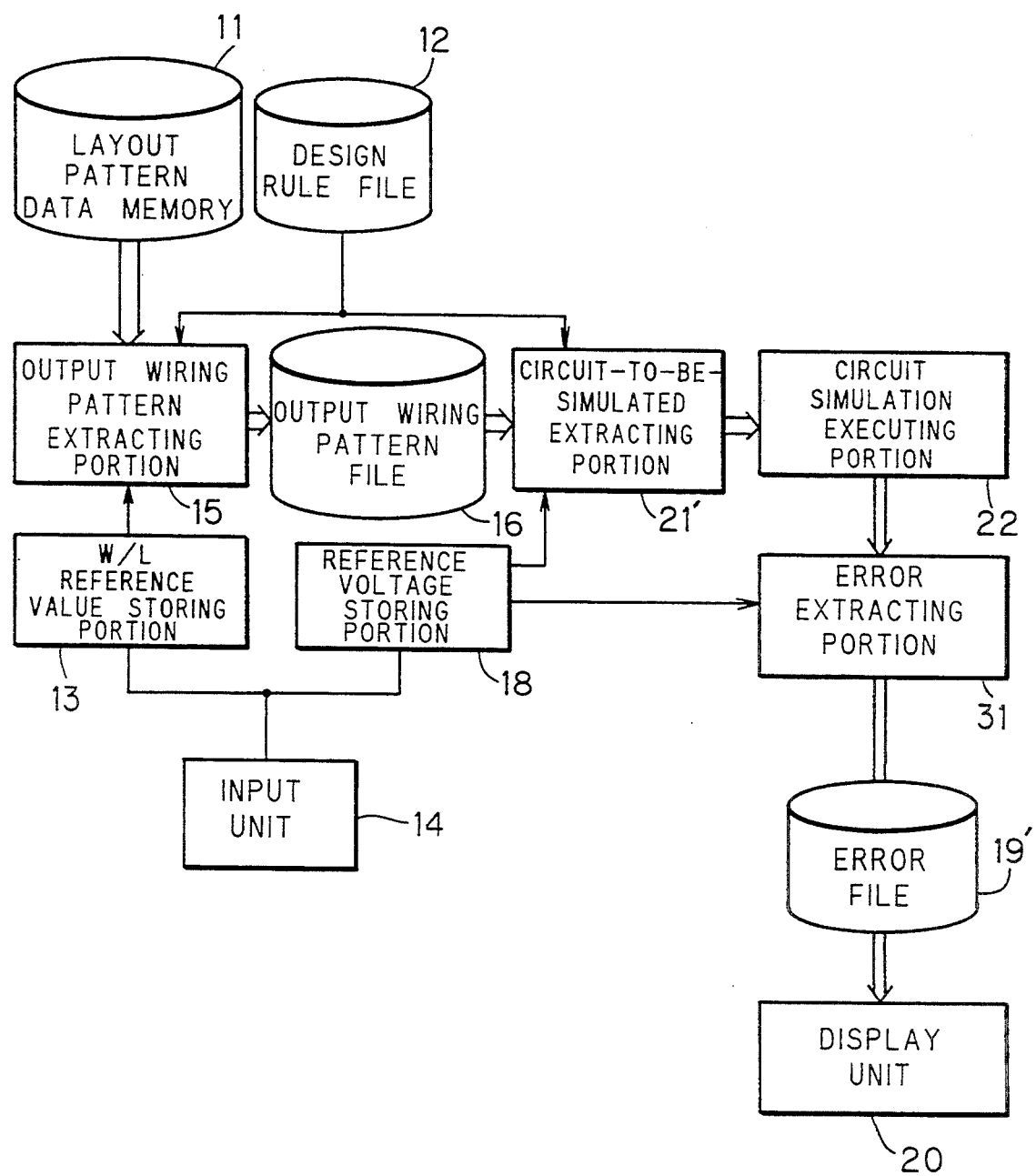
FIG. 18 is a block diagram of the crosstalk verification device according to a third preferred embodiment of the present invention.

FIG. 18 is a block diagram of the crosstalk verification device according to a third preferred embodiment of the present invention. The third preferred embodiment differs from the first preferred embodiment shown in FIG. 1 in that the device of the third preferred embodiment comprises a circuit-to-be-simulated extracting portion 21', the circuit simulation executing portion 22 and an error extracting portion 31 and, accordingly, in the connection of the portions 21', 22 and 31 to their peripheral portions. The differences will be described hereinafter, and the description of the other components identical with those of the first preferred embodiment will be omitted herein.

The circuit-to-be-simulated extracting portion 21' processes the coordinate data of the output wiring pattern in the output wiring pattern file 16 while referring to the contents of the design rule file 12 to thereby perform a first crosstalk error verification therein. The circuit-to-be-simulated portion 21' extracts, as the circuit to be simulated, the equivalent circuit of the layout pattern including the overlap/parallel portion judged as the crosstalk error in the first crosstalk error verification and its peripheral portion. The extracted circuit data is outputted to the circuit simulation executing portion 22.

Figure 19:
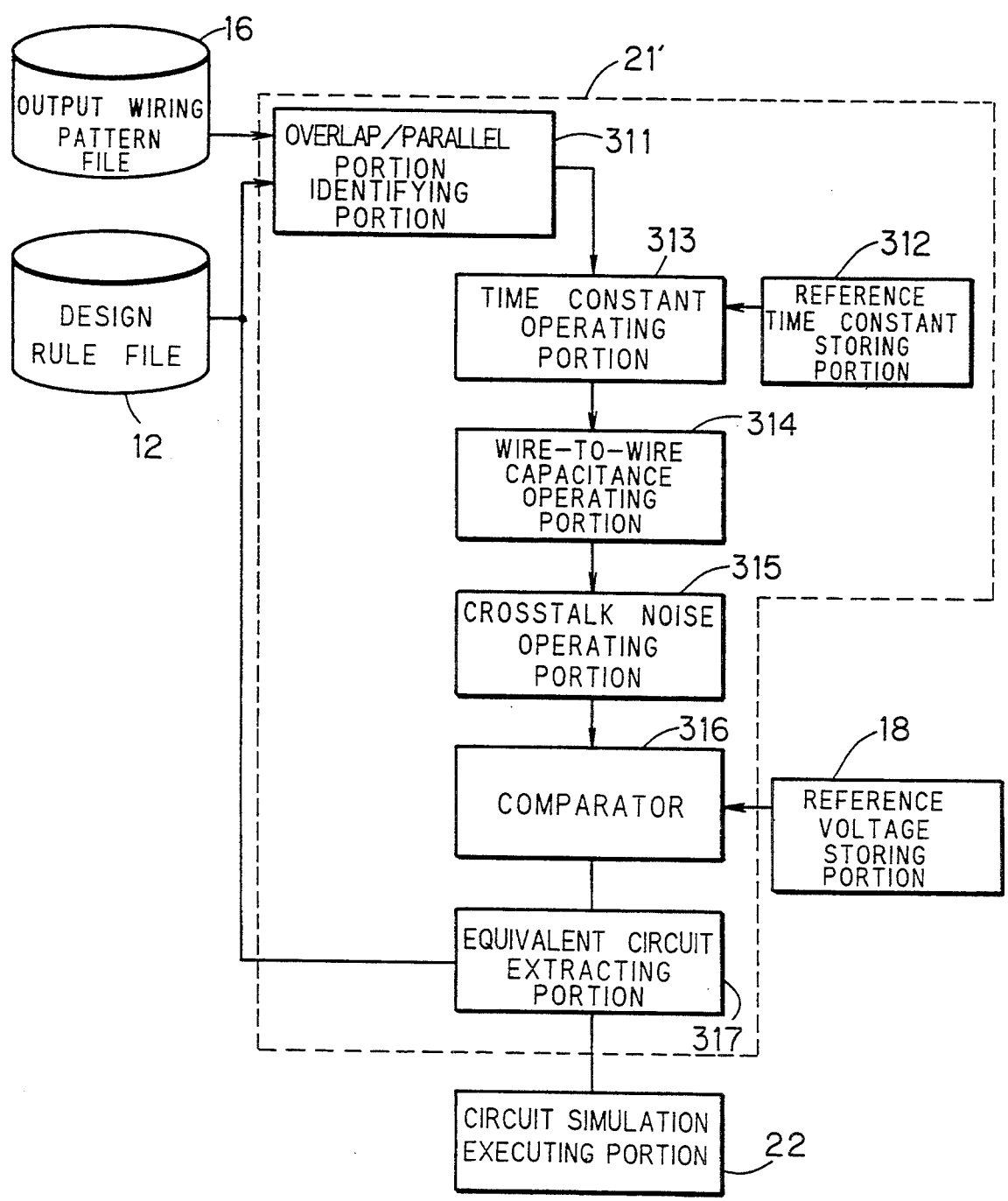
FIG. 19 is a detailed block diagram of the circuit-to-be-simulated extracting portion of the third preferred embodiment.

FIG. 19 is a detailed block diagram of the circuit-to-be-simulated extracting portion 21'. The circuit-to-be-simulated extracting portion 21' comprises an overlap/parallel portion identifying portion 311, a reference time constant storing portion 312, a time constant operating portion 313, a wire-to-wire capacitance operating portion 314, a crosstalk noise operating portion 315, a comparator 316, and an equivalent circuit extracting portion 317.

In the same fashion as the overlap/parallel portion identifying portion 171 of the first preferred embodiment, the overlap/parallel portion identifying portion 311 identifies the overlap portion 57 and the parallel portion 58 between the output wire 55 of the transistor prone to exert crosstalk influence and the output wire 56 of the transistor susceptible to crosstalk as shown in FIGS. 6 and 8 and determines the distance D between the wires in the parallel portion 58 as a function of the coordinate data of the output wiring pattern stored in the output wiring pattern file 16. The overlap/parallel portion identifying portion 311 also refers to the description of the definition (v) in the design rule file 12 to regard only the parallel portion 58 in which the distance D is indicated by the definition (v) as the effective parallel portion 58. The overlap/parallel portion identifying portion 311 applies the coordinate data for specifying the overlap portion 57 and the effective parallel portion 58 to the time constant operating portion 313.

The time constant operating portion 313, referring the description of the definition (vi) in the design rule file 12 provided through the overlap/parallel portion identifying portion 311, calculates the output load capacitance $C_n$ of the transistor prone to exert crosstalk influence which is extracted from the overlap/parallel portion identifying portion 311 and has the overlap/parallel portion. The time constant operating portion 313 determines the time constant $\tau$ in the output wire of the transistor prone to exert crosstalk influence from Equation (1) using the calculated output load capacitance $C_n$.

The time constant operating portion 313 compares the time constant $\tau$ calculated from Equation (1) with the reference time constant previously stored in the reference time constant storing portion 312 to extract the coordinate data of the overlap/parallel portion of the output wire of the transistor prone to exert crosstalk influence which has the time constant $\tau$ that is smaller than the reference time constant. The extracted coordinate data is applied to the wire-to-wire capacitance operating portion 314. The storage of the reference time constant in the reference time constant storing portion 312 may be set by the user by way of the input unit 14 as described in the first and second preferred embodiments.

In the same fashion as the wire-to-wire capacitance operating portion 174 of the first preferred embodiment, the wire-to-wire capacitance operating portion 314 calculates the area S of the overlap portion (FIG. 5) from the coordinate data extracted from the time constant operating portion 312 to calculate the capacitance CP1 of the overlap portion from Equation (2) as a function of the area S. At the same time, the wire-to-wire capacitance operating portion 314 calculates the capacitance CP2 of the parallel portion from Equation (3) using the effective length l (FIG. 8) of the parallel portion and the distance D between the wires (FIG. 9) in the effective parallel portion 58 from the coordinate data given from the time constant operating portion 313.

The crosstalk noise operating portion 315 applies to the comparator 316 the maximum and minimum values $V_r$ and $V_f$ of the crosstalk noise produced in the output wire of the transistor susceptible to crosstalk when the output voltage in the output wire of the transistor prone to exert crosstalk influence rises and falls, respectively, in the same fashion as the crosstalk noise operating portion 175 of the first preferred embodiment.

The crosstalk noise reference voltages are previously stored in the reference voltage storing portion 18 from the input unit 14. The comparator 316 compares the maximum and minimum values $V_r$ and $V_f$ of the crosstalk noise determined in the crosstalk noise operating portion 315 with the respective reference voltages stored in the reference voltage storing portion 18. The comparator 316 applies the error signal to the equivalent circuit extracting portion 317 when the maximum and minimum values $V_r$ and $V_f$ exceed the reference voltages, respectively.

The equivalent circuit extracting portion 317 refers to the design rule file 12 and extracts, as the circuit to be simulated, the equivalent circuit of at least the layout pattern including the transistor susceptible to crosstalk which is judged as the crosstalk error as a function of the error signal from the comparator 316, its output wire, and the device whose input is connected to the output wire and also including the transistor prone to exert crosstalk influence which has the overlap/parallel portion with that output wire, its output wire, and the device whose input is connected to the output wire. The extracted circuit data is applied to the circuit simulation executing portion 22.

On receipt of the circuit-to-be-simulated data extracted from the equivalent circuit extracting portion 317, the circuit simulation executing portion 22 executes the circuit simulation on the circuit to be simulated to apply a simulation-resultant crosstalk noise voltage to the error extracting portion 31.

The error extracting portion 31 compares the simulation-resultant crosstalk noise voltage with the reference voltages previously given from the input unit 14 and stored in the reference voltage storing portion 18 to thereby perform a second crosstalk verification. The simulation-resultant crosstalk noise voltage, if exceeding the reference voltages, is an error, so that the coordinate data of the portion is stored in an error file 19'.

The display unit 20 receives the layout pattern data stored in the layout pattern data memory 11 and the coordinate data stored in the error file 19' to display the layout pattern in which the error portion is emphasized for ease of visual recognition as shown in FIGS. 12 and 13.

Figure 20:
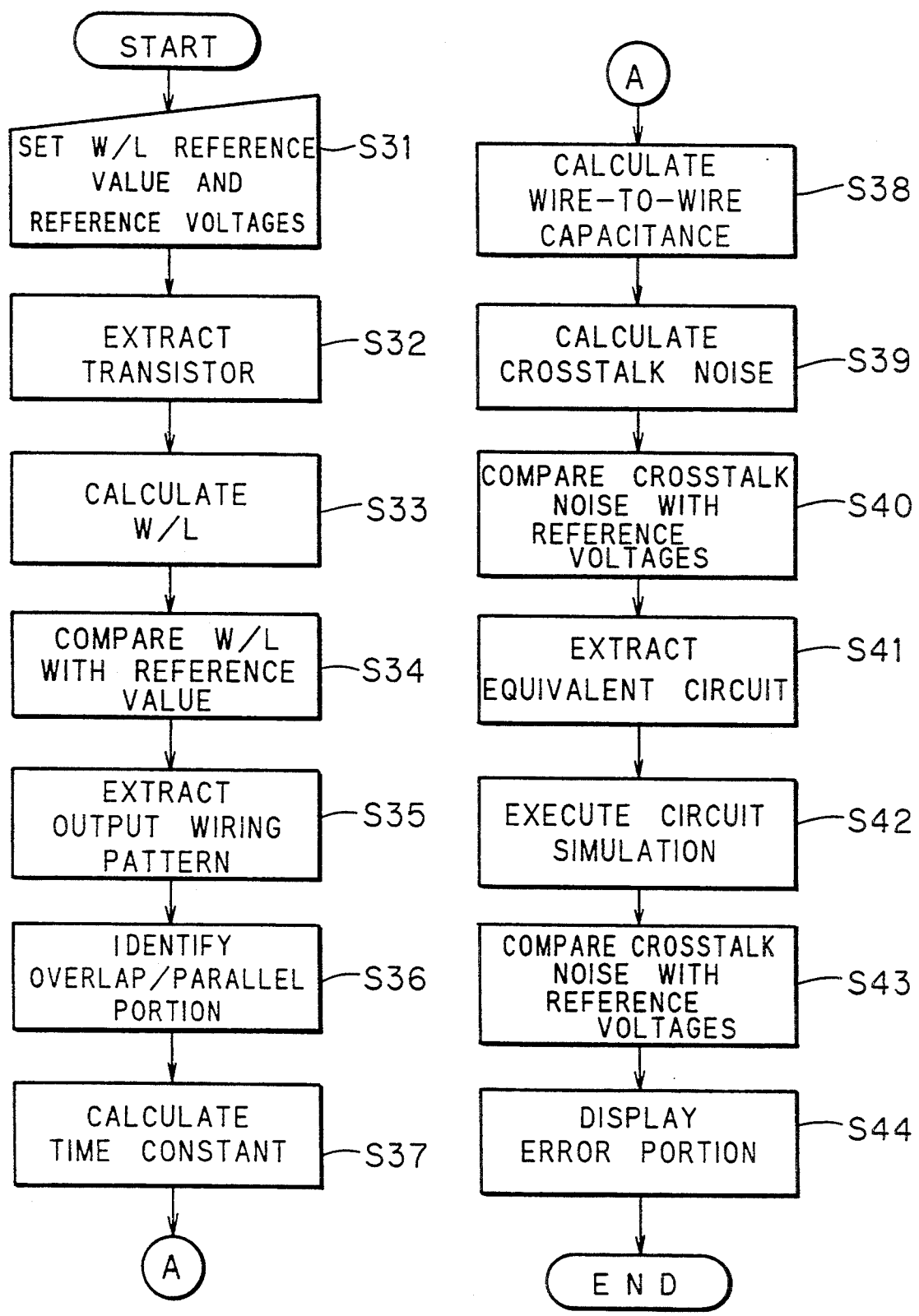
FIG. 20 is a flow chart of procedure when the function of the crosstalk verification device of the third preferred embodiment is achieved by means of the computer.

FIG. 20 is a flow chart of procedure when the function of the crosstalk verification device of FIG. 18 is achieved by means of the well-known computer including the storage device and the CPU. The program for the procedure is stored in the storage device. The CPU operates in accordance with the program to thereby achieve the function of the extracting portions 15, 21' and 31. The storage device also functions as the memory 11, the files 12, 16, 19' and the storing portions 13, 18, 312.

In the step S31, the W/L reference value and the reference voltages are stored in the W/L reference value storing portion 13 and the reference voltage storing portion 18, respectively, by means of the input unit 14.

In the step S32, the transistor in the layout pattern stored in the layout pattern data memory 11 is identified by the reference to the description of the definition (i) in the design rule file 12, and the pattern data of the transistor is extracted.

In the step S33, the definition (ii) in the design rule file 12 is applied to the pattern data of the extracted transistor to thereby calculate the transistor size W/L.

In the step S34, the transistor size W/L is compared with the reference value stored in the W/L reference value storing portion 13 to thereby identify the transistor prone to exert crosstalk influence and the transistor susceptible to crosstalk.

In the step S35, the coordinate data of the output wiring patterns of the transistor prone to exert crosstalk influence and the transistor susceptible to crosstalk are extracted from the layout pattern data stored in the layout pattern data memory 11. The extracted coordinate data are stored in the output wiring pattern file 16 such that the coordinate data related to the transistor susceptible to crosstalk is enabled to be identified.

In the step S36, the overlap portion 57 (FIG. 6) and the parallel portion 58 (FIG. 8) between the output wire 55 of the transistor prone to exert crosstalk influence and the output wire 56 of the transistor susceptible to crosstalk are identified as a function of the coordinate data stored in the output wiring pattern file 16. Only the parallel portion 58 in which the distance D between the wires is within the predetermined range described in the definition (v) in the design rule file 12 is regarded as effective.

Calculated in the step S37 is the output load capacitance of the transistor prone to exert crosstalk influence which has the overlap portion 57 (FIG. 6) and the parallel portion 58 (FIG. 9) in its output wire. The time constant $\tau$ in the output wire of the transistor prone to exert crosstalk influence is determined by the application of Equation (1) from the calculated output load capacitance. Then, extracted is the coordinate data of the overlap/parallel portion of the output wire of the transistor having the time constant that is smaller than the reference time constant stored in the reference time constant storing portion 312.

In the step S38, the wire-to-wire capacitance of the overlap/parallel portion extracted in the step S37 is calculated from Equation (2) or (3). When a plurality of overlap portions or parallel portions are present, the wire-to-wire capacitances for the respective portions are calculated and then the sum of the capacitances is determined.

The crosstalk noise generated in the output wire of the transistor susceptible to crosstalk at the time of rising and falling is calculated from Equations (4) and (5) in the step S39.

In the step S40, the crosstalk noise provided in the step S39 is compared with the reference voltages stored in the reference voltage storing portion 18. The first crosstalk verification is performed as a function of the comparison result.

In the step S41, extracted as the circuit to be simulated is the equivalent circuit of at least the layout pattern including the transistor susceptible to crosstalk which is judged as the crosstalk error in the step S40, its output wire, and the device whose input is connected to the output wire, and also including the transistor prone to exert crosstalk influence which has the overlap/parallel portion with that output wire, its output wire, and the device whose input is connected to the output wire.

In the step S42, the circuit simulation is executed on the circuit to be simulated provided in the step S41 to determine the crosstalk noise voltage. In the step S43, the crosstalk noise voltage is compared with the reference voltages previously given from the input unit 14 and stored in the reference voltage storing portion 18, and then the second crosstalk verification is performed. The crosstalk noise voltage, if exceeding the reference voltages, is judged as the error, so that the coordinate data of the portion is stored in the error file 19'.

In the step S44, the error portion is displayed on the layout pattern by the display unit 20 as a function of the coordinate data stored in the error file 19'.

The crosstalk verification device of the third preferred embodiment selects the transistor having the highly probable danger of crosstalk occurrence by means of the time constant $\tau$ of the transistor prone to exert crosstalk influence. The first crosstalk verification is performed as a function of the wire-to-wire capacitance of the overlap/parallel portion of the selected transistor, and then the second crosstalk verification is performed by the execution of the circuit simulation, so that the presence/absence of the portion having the crosstalk occurrence danger is verified efficiently.

In the third preferred embodiment, the same reference voltages stored in the reference voltage storing portion 18 are used in common for the first and second crosstalk verifications. The present invention is not limited thereto. Different reference voltages may be used for the first and second crosstalk verifications.

The crosstalk verification device of the second preferred embodiment (FIG. 15) performs the crosstalk verification by displaying by the display unit 20 the crosstalk waveforms as the simulation result of the circuit simulation executing portion 22. Alternatively, the crosstalk verification device of the second preferred embodiment may be provided with means corresponding to the error extracting portion 31 to perform the second crosstalk verification as a function of the result of comparison between the reference voltages and the crosstalk noise provided as the simulation result of the circuit simulation executing portion 22 by this means as described in the third preferred embodiment.

Conversely, the crosstalk verification device of the third preferred embodiment (FIG. 18) may perform the crosstalk verification by displaying directly by the display unit 20 the crosstalk waveforms as the simulation result of the circuit simulation executing portion 22 as described in the second preferred embodiment.

While the invention has been shown and described in detail, the foregoing description is in all aspects illustrative and not restrictive. It is therefore understood that numerous modifications and variations can be devised without departing the scope of the invention.

What is claimed is:

1. A crosstalk verification device comprising:

first providing means for providing layout pattern data specifying a layout pattern to be verified;

second providing means for providing a design rule on said layout pattern to be verified;

first storing means for storing a first reference on the size of a transistor prone to exert the influence of crosstalk and a second reference on the size of a transistor susceptible to crosstalk;

first extracting means connected to said first and second providing means and said first storing means for processing said layout pattern data while referring to said design rule and said first and second references to extract, from said layout pattern data, data on output wiring patterns of a first transistor satisfying said first reference and a second transistor satisfying said second reference out of transistors in said layout pattern to be verified;

second storing means for storing a third reference on the magnitude of crosstalk noise;

second extracting means connected to said first extracting means and said second storing means for calculating a wire-to-wire capacitance of an overlap/parallel portion between output wires of said first and second transistors as a function of said data on said output wiring patterns to determine the magnitude of crosstalk noise produced when an output signal of said second transistor rises and falls as a function of said wire-to-wire capacitance, to extract said overlap/parallel portion as an error portion if said magnitude of crosstalk noise exceeds said third reference;

display means connected to said second extracting means for visually displaying said error portion;

first file means connected to said first extracting means for accumulating said data on said output wiring patterns extracted by said first extracting means to apply said accumulated data to said second extracting means;

second file means connected to said second extracting means for accumulating data on said error portion extracted by said second extracting means to apply said accumulated data to said display means;

wherein, said first extracting means comprises:
data extracting means connected to said first and second providing means for extracting coordinate data on said transistors in said layout pattern;

transistor size operating means connected to said data extracting means for calculating transistor sizes of said transistors size in said layout pattern as a function of said coordinate data;

comparing means connected to said transistor size operating means and said first storing means for comparing each of said transistor sizes with said first and second references to identify said first and second transistors;

wherein, said second extracting means comprises:
overlap/parallel portion identifying means connected to said first and second providing means for identifying said overlap/parallel portion between said output wires of said first and second transistors;

time constant operating means connected to said overlap/parallel portion identifying means and said second providing means for calculating a time constant in said output wire of said first transistor having said overlap/parallel portion with said output wire of said second transistor to extract an overlap/parallel portion of an output wire of a third transistor having a highly probable danger of crosstalk noise occurrence as a function of said time constant in accordance with a predetermined reference;

wire-to-wire capacitance operating means connected to said time constant operating means and said second providing means for calculating said wire-to-wire capacitance of said. overlap/parallel portion of said output wire extracted by said time constant operating means;

crosstalk noise operating means connected to said wire-to-wire capacitance operating means for calculating said magnitude of crosstalk noise produced when said output signal of said second transistor rises and falls as a function of said wire-to wire capacitance; and error portion extracting means connected to said crosstalk noise operating means and said second storing means for extracting said overlap/parallel portion as said error portion if said magnitude of crosstalk noise exceeds said third reference.

2. The crosstalk verification device of claim 1, wherein
said design rule includes a definition defining a value of a distance between said output wires, and
said overlap/parallel portion identifying means makes effective only said parallel portion of said output wires approximate in distance to said value.

3. The crosstalk verification device of claim 2, wherein
said time constant operating means comprises:
third storing means for storing a fourth reference on said time constant,
said overlap/parallel portion of said output wire of said third transistor being extracted as a function of a comparison result between said calculated time constant and said fourth reference.

4. The crosstalk verification device of claim 1, wherein
said first providing means includes a layout pattern data memory.

5. The crosstalk verification device of claim 1, wherein
said second providing means includes a design rule file.

6. A crosstalk verification device comprising:
first providing means for providing layout pattern data specifying a layout pattern to be verified;
second providing means for providing a design rule on said layout pattern to be verified;
storing means for storing a first reference on the size of a transistor prone to exert the influence of crosstalk and a second reference on the size of a transistor susceptible to crosstalk;
first extracting means connected to said first and second providing means and said storing means for processing said layout pattern data while referring to said design rule and said first and second references to extract, from said layout pattern data, data on output wiring patterns of a first transistor satisfying said first reference and a second transistor satisfying said second reference out of transistors in said layout pattern to be verified;
second extracting means connected to said first extracting means for specifying an output wiring pattern required to be subjected to crosstalk verification in accordance with a predetermined reference as a function of a time constant in an output wire of said first transistor having an overlap/parallel portion with an output wire of said second transistor from said data on said output wiring patterns to extract an equivalent circuit of said specified output wiring pattern as a circuit to be simulated; and
simulation executing means connected to said second extracting means for executing a circuit simulation on said circuit to be simulated to perform crosstalk noise verification.

7. The crosstalk verification device of claim 6, wherein
said first extracting means comprises:
data extracting means connected to said first and second providing means for extracting coordinate data on said transistors in said layout pattern;
transistor size operating means connected to said data extracting means for calculating transistor sizes of said transistors in said layout pattern as a function of said coordinate data; and
comparing means connected to said transistor size operating means and said storing means for comparing each of said transistor sizes with said first and second references to identify said first and second transistors.

8. The crosstalk verification device of claim 7, wherein
said second extracting means comprises:
overlap/parallel portion identifying means connected to said first and second providing means and said first extracting means for identifying said overlap/parallel portion between said output wires of said first and second transistors;
time constant operating means connected to said overlap/parallel portion identifying means for calculating said time constant in said output wire of said first transistor having said overlap/parallel portion with said output wire of said second transistor to extract an overlap/parallel portion of an output wire of a third transistor having a highly probable danger of crosstalk noise occurrence as a function of said time constant in accordance with a predetermined reference;
wire-to-wire capacitance operating means connected to said time constant operating means for calculating a wire-to-wire capacitance of said overlap/parallel portion of said output wire extracted by said time constant operating means; and
equivalent circuit extracting means connected to said wire-to-wire capacitance operating means for extracting, as said circuit to be simulated, said equivalent circuit including said overlap/parallel portion of said output wire extracted by said time constant operating means and its peripheral portion.

9. The crosstalk verification device of claim 8, wherein
said design role includes a definition defining a value of a distance between said output wires, and
said overlap/parallel portion identifying means makes effective only said parallel portion of said output wires approximate in distance to said value.

10. The crosstalk verification device of claim 9, wherein
said time constant operating means comprises:
second storing means for storing a third reference on said time constant,
said overlap/parallel portion of said output wire of said third transistor being extracted as a function of a comparison result between said calculated time constant and said third reference.

11. A crosstalk verification device comprising:
first providing means for providing layout pattern data specifying a layout pattern to be verified;
second providing means for providing a design rule on said layout pattern to be verified;
first storing means for storing a first reference on the size of a transistor prone to exert the influence of crosstalk and a second reference on the size of a transistor susceptible to crosstalk;
first extracting means connected to said first and second providing means and said first storing means for processing said layout pattern data while referring to said design rule and said first and second references to extract, from said layout pattern data, data on output wiring patterns of a first transistor satisfying said first reference and a second transistor satisfying said second reference out of transistors in said layout pattern to be verified;
second storing means for storing a third reference on the magnitude of crosstalk noise;
third storing means for storing a fourth reference on the magnitude of crosstalk noise;
second extracting means connected to said first extracting means and said second storing means for determining a wire-to-wire capacitance of an overlap/parallel portion between output wires of said first and second transistors as a function of said data on said output wiring patterns to determine the magnitude of crosstalk noise produced when an output signal of said second transistor rises and falls as a function of said wire-to-wire capacitance, to extract a circuit including said overlap/parallel portion and its peripheral portion as a circuit to be simulated if said magnitude of crosstalk noise exceeds said third reference;
simulation executing means connected to said second extracting means for executing a circuit simulation on said circuit to be simulated to calculate a simulation-resultant crosstalk noise;
third extracting means connected to said simulation executing means and said third storing means for extracting said overlap/parallel portion of said circuit to be simulated as an error portion if the magnitude of said simulation-resultant crosstalk noise exceeds said fourth reference; and
display means connected to said third extracting means for visually displaying said error portion.

12. The crosstalk verification device of claim 11, wherein.
said first extracting means comprises:
data extracting means connected to said first and second providing means for extracting coordinate data on said transistors in said layout pattern;
transistor size operating means connected to said data extracting means for calculating transistor sizes of said transistors in said layout pattern as a function of said coordinate data; and
comparing means connected to said transistor size operating means and said first storing means for comparing said transistor size with said first and second references to identify said first and second transistors.

13. The crosstalk verification device of claim 12, wherein
said second extracting means comprises:
overlap/parallel portion identifying means connected to said first and second providing means and said first extracting means for identifying said overlap/parallel portion between said output wires of said first and second transistors;
time constant operating means connected to said overlap/parallel portion identifying means for calculating a time constant in said output wire of said first transistor having said overlap/parallel portion with said output wire of said second transistor to extract an overlap/parallel portion of an output wire of a third transistor having a highly probable danger of crosstalk noise occurrence as a function of said time constant in accordance with a predetermined reference;
wire-to-wire capacitance operating means connected to said time constant operating means for calculating said wire-to-wire capacitance of said overlap/parallel portion of said output wire extracted by said time constant operating means;
crosstalk noise operating means connected to said wire-to-wire capacitance operating means for calculating said magnitude of crosstalk noise produced when said output signal of said second transistor rises and falls as a function of said wire-to-wire capacitance; and
equivalent circuit extracting means connected to said crosstalk noise operating means and said second storing means for extracting, as said circuit to be simulated, an equivalent circuit of said layout pattern including said overlap/parallel portion and its peripheral portion if said magnitude of crosstalk noise exceeds said third reference.

14. The crosstalk verification device of claim 13, wherein
said design rule includes a definition defining a value of a distance between said output wires, and
said overlap/parallel portion identifying means makes effective only said parallel portion of said output wires approximate in distance to said value.

15. The crosstalk verification device of claim 14, wherein
said time constant operating means comprises:
fourth storing means for storing a fifth reference on said time constant,
said overlap/parallel portion of said output wire of said third transistor being extracted as a function of a comparison result between said calculated time constant and said fifth reference.

16. The crosstalk verification device of claim 11, wherein
said third reference is equal to said fourth reference.

* * * * *